US008283981B2

(12) United States Patent
Wakamatsu

(10) Patent No.: US 8,283,981 B2
(45) Date of Patent: Oct. 9, 2012

(54) OPERATIONAL AMPLIFIER HAVING A COMMON MODE FEEDBACK CIRCUIT PORTION

(75) Inventor: Takeshi Wakamatsu, Kanagawa (JP)

(73) Assignee: Lapis Semiconductor Co., Ltd. (JP)

( * ) Notice: Subject to any disclaimer, the term of this patent is extended or adjusted under 35 U.S.C. 154(b) by 0 days.

(21) Appl. No.: 13/101,464

(22) Filed: May 5, 2011

(65) Prior Publication Data

US 2011/0285465 A1 Nov. 24, 2011

(30) Foreign Application Priority Data

May 20, 2010 (JP) ................................ 2010-116262

(51) Int. Cl.
*H03F 3/45* (2006.01)
(52) U.S. Cl. ........................................ 330/258; 330/255
(58) Field of Classification Search .................... 330/69, 330/255, 258, 260, 261
See application file for complete search history.

(56) References Cited

U.S. PATENT DOCUMENTS

| 5,212,455 | A * | 5/1993 | Pernici et al. ................. 330/253 |
| 6,697,001 | B1 * | 2/2004 | Oliaei et al. .................. 341/143 |
| 7,167,047 | B2 * | 1/2007 | Botti et al. ..................... 330/251 |
| 7,446,603 | B2 * | 11/2008 | Wong et al. ...................... 330/10 |
| 7,586,373 | B2 * | 9/2009 | Kim .............................. 330/257 |

OTHER PUBLICATIONS

M. Yoshioka et al.; "A 0.8V 10b 80MS/s 6.5mW Pipelined ADC with Regulated Overdrive Voltage Biasing"; ISSC 2007, Session 25 Nyquist ADC Techniques 25.1; pp. 452-453, 614; Feb. 2007.

* cited by examiner

*Primary Examiner* — Henry Choe
(74) *Attorney, Agent, or Firm* — Studebaker & Brackett PC; Donald R. Studebaker

(57) ABSTRACT

An operational amplifier that can suppress lowering of the current driving capability while performing a self adjustment of the common mode voltage is disclosed. A common mode voltage adjusting transistor and an auxiliary transistor are connected in parallel with a low-voltage side drive transistor of each of push-pull amplifying circuits that produce first and second amplified difference signals having different polarities in accordance with drive signals obtained by level-shifting a difference signal indicating a difference value of the levels of the first and second input signals by predetermined values. Current drive capabilities during a period of outputting said first and second amplified difference signals and a common mode voltage adjusting period respectively are increased by driving said auxiliary drive transistor by alternately using the drive signal obtained by level-shifting the difference signal and a common mode voltage adjusting signal.

4 Claims, 4 Drawing Sheets

1

OPERATIONAL AMPLIFIER HAVING A COMMON MODE FEEDBACK CIRCUIT PORTION

BACKGROUND OF THE INVENTION

1. Field of the Invention

The present invention relates to an operational amplifier, and more particularly, to an operational amplifier having a common mode feedback circuit portion (hereinafter, referred to as CMFB) for self-adjusting a common mode voltage.

2. Description of the Related Art

As an example of operational amplifiers of this type, there is a known operational amplifier having a differential amplification portion that obtains a difference signal corresponding to a difference value between two input signals, a push-pull circuit that outputs a differential output signal according to the difference signal, and a CMFB circuit as described above.

In recent years, there is a proposal of a two-stage amplifier which is provided with a level-shift circuit in a stage preceding the push-pull circuit described above, in order to ensure that the amplifier operates under low power supply voltage (see FIG. 25, 1.2 of Non-Patent Literature 1 described below). In such a two-stage amplifier, a drive voltage that is obtained by shifting the level of the above-described difference signal by means of the level-shift circuit is supplied to gate terminals of a p-channel transistor and an n-channel transistor that together constitute the push-pull circuit (P-P Amp). The two-stage amplifier is provided with a common mode voltage generating circuit for generating a common mode voltage adjustment signal that indicates a difference value between a center value of difference output signals (OP, OM) of two routes and a predetermined common mode reference signal, and an n-channel transistors for adjusting a common mode voltage in the difference output signal (OP, OM) in accordance with the common mode voltage adjustment signal. The n-channel transistor provided for adjusting the common mode voltage is connected in parallel to the n-channel drive transistor in the push-pull circuit, and is configured to supply a current on the line of the difference output signal (OP, OM) in order to perform an adjustment to make the common mode voltage identical with the common mode reference voltage value.

Consequently, there has been a problem that the output current driving capability as the push-pull circuit is reduced by an amount corresponding to a current driving capability of the n-channel transistor that is provided for adjusting the common mode voltage.

Non-Patent Literature 1: Masato Yoshioka, Masahiro Kudo, Toshihiro Mori, Sanroku Tsukamoto, "A 0.8V 10 b 80 MS/s 6.5 mW Pipelined ADC with Regulated Overdrive Voltage Biasing," ISSCC2007, Session 25 Nyquist ADC Techniques 25.1, pp. 452-453, Feb. 2007.

SUMMARY OF THE INVENTION

The present invention has been made to solve the problem described above, and an objective of the present invention is to provide an operational amplifier that can suppress lowering of the current driving capability while performing a self adjustment of the common mode voltage.

An operational amplifier according to the present invention is an operational amplifier for amplifying difference signals that indicate a difference value between levels of the first and second input signals and outputting first and second amplified difference signals having different polarities, and comprises: level shift portions which produce as drive signals signals obtained by level shifting said difference signals by predetermined values; a push-pull amplification circuits which produce said first amplified difference signal and said second amplified difference signal in accordance with said drive signals; a common mode voltage adjustment signal generating portion which generates a common mode voltage adjustment signal indicating a difference between a center value of said first and second amplified difference signals and a common mode reference voltage value; common mode voltage adjusting transistors each of which is connected in parallel to a low voltage side drive transistor of each of said push-pull amplification circuit and allows a flow of a current according to said common mode voltage adjustment signal; auxiliary drive transistors each of which is connected in parallel to a low voltage side drive transistor of each of said push-pull amplification circuit and allows a flow of a current according to an auxiliary drive signal; and auxiliary drive control portions each of which alternately supplies said signal obtained by level shifting said difference signal and said common mode voltage adjustment signal to said auxiliary drive transistor as said auxiliary drive signal.

In accordance with the present invention, a current driving capability during a period in which amplified difference signal is outputted by the push-pull drive circuit and a current driving capability in a common mode voltage adjusting period are both increased by providing an auxiliary transistor connected in parallel with a low-voltage side drive transistor of the push-pull amplifying circuit. Thus, a self-adjustment of the common mode voltage at a high speed is enabled and lowering of the current supply capability is suppressed at the same time.

DETAILED DESCRIPTION OF THE INVENTION

The common mode voltage adjusting transistor and the auxiliary transistor are connected in parallel with the low-voltage side drive transistor of each of the push-pull amplifying circuits that produce first and second amplified difference signals having different polarities in accordance with drive signals obtained by level-shifting a difference signal indicating a difference value of the levels of the first and second input signals by predetermined values. Current drive capability during a period of outputting said first and second amplified difference signals and current drive capability during a common mode voltage adjusting period are increased by driving said auxiliary drive transistor by alternately using the drive signal obtained by level-shifting the difference signal and a common mode voltage adjusting signal.

Figure 1:
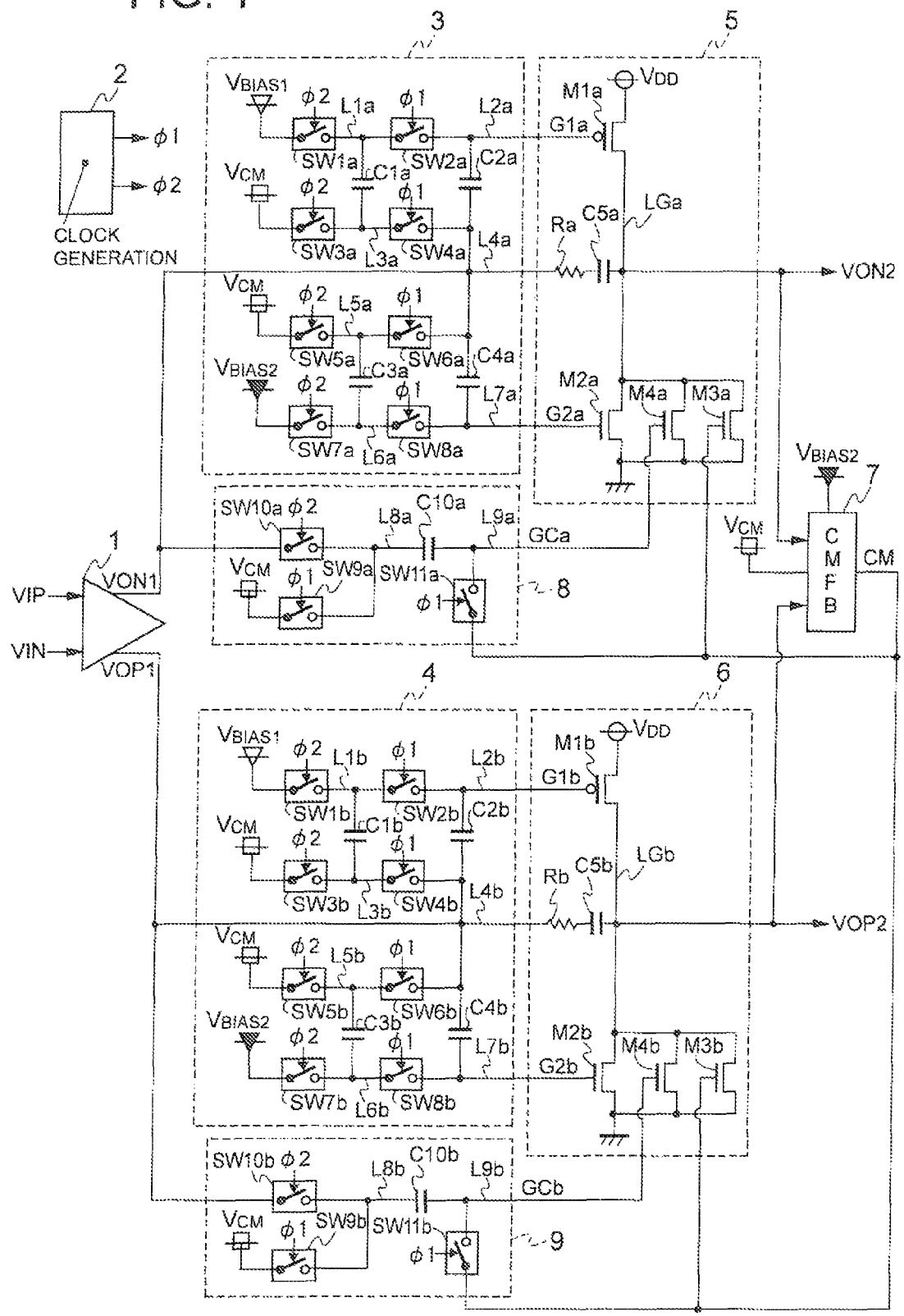
FIG. 1 is a diagram showing the structure of an operational amplifier according to the present invention.

FIG. 1 is a diagram showing the structure of the operational amplifier according to the present invention.

As shown in FIG. 1, the operational amplifier according to the present invention comprises a differential amplification portion 1, a shift-clock generating portion 2, level shift portions 3 and 4, push-pull amplification portions 5 and 6, a common mode voltage adjustment signal generating portion 7 (hereinafter, referred to as CMFB 7), and auxiliary drive control portions 8 and 9.

The differential amplification portion 1 operates to obtain a difference value between levels of two input signals VIP and VIN supplied thereto, and generates a difference signal VOP1 that indicates the difference value in terms of positive polarity level and a difference signal VON1 that indicates the difference value in terms of negative polarity level. The differential amplification portion 1 supplies the difference signal VOP1 to the level shift portion 3 and the push-pull amplification portion 5 and supplies the difference signal VON1 to the level shift portion 4 and the push-pull amplification portion 6.

Figure 2:
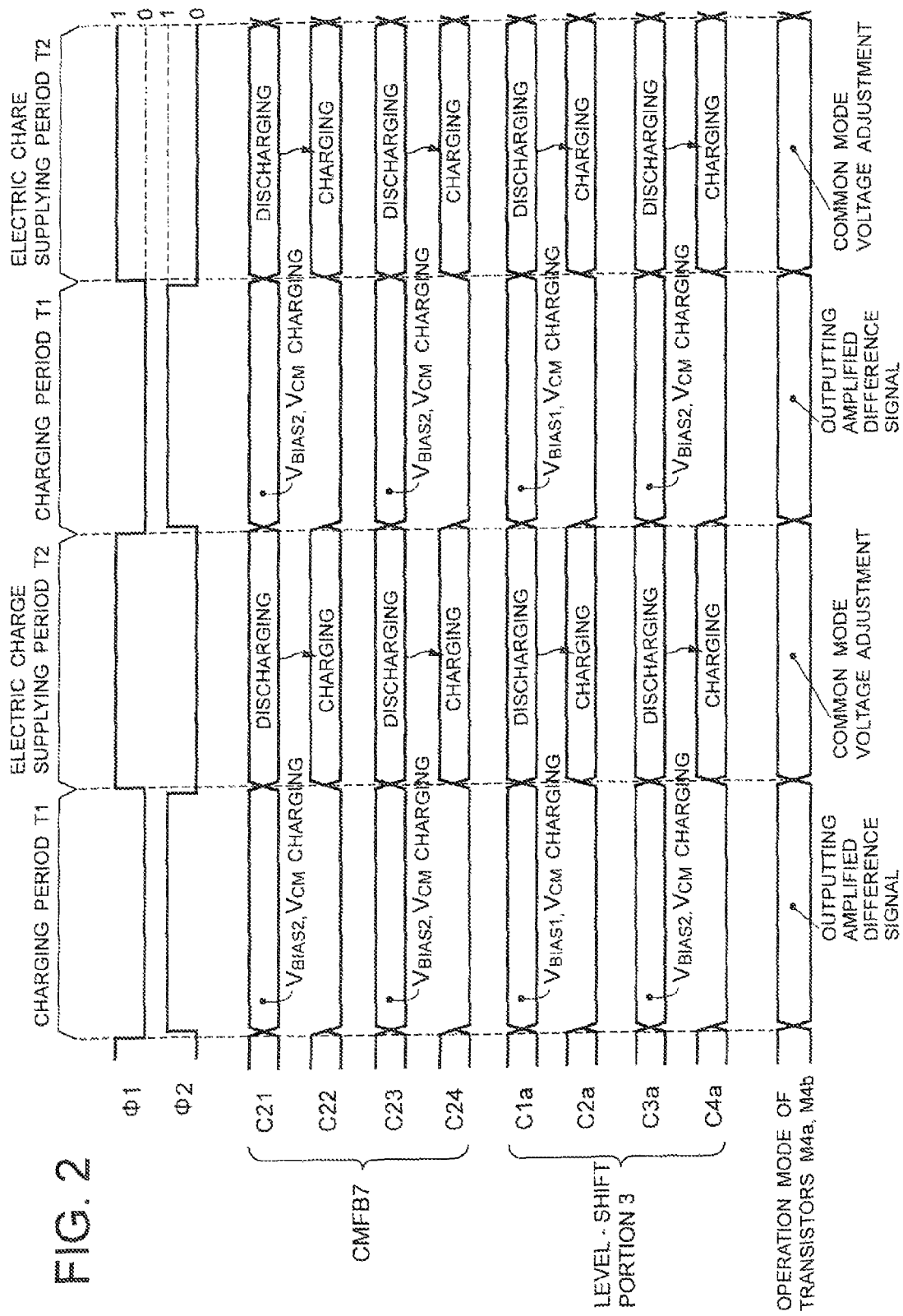
FIG. 2 is a diagram for explaining an internal operation of the operational amplifier shown in FIG. 1.

The shift-clock generating portion 2 generates clock signals $\phi1$ and $\phi2$ that alternately have a logical level 1 and a logical level 0 at predetermined intervals, in mutually inverted states as depicted in FIG. 2. The clock signals $\phi1$ and $\phi2$ are supplied to level shift portions 3 and 4 and to the auxiliary drive control portions 8 and 9 respectively by the shift-clock generating portion 2.

The level shift portion 3 is a switched capacitor type level shifter which comprises switching elements SW1a to SW8a and capacitors C1a to C4a. The switching element SW1a assumes its OFF state when the clock signal $\phi2$ is in the logical level 0, and assumes its ON state when the clock signal $\phi2$ in the logical level 1 so as to apply a bias voltage $V_{BIAS1}$ to a line L1a. The bias voltage $V_{BIAS1}$ is a fixed bias voltage having a voltage value capable of driving MOS transistors M1a and M1b (described later) of each of the push-pull amplification portions 5 and 6. The switching element SW2a assumes its OFF state when the clock signal $\phi1$ is in the logical level 0, and assumes its ON state when the clock signal $\phi1$ is in the logical level 1 so as to apply the voltage on the line L1a to a line L2a. The switching element SW3a assumes its state when the clock signal $\phi2$ is in the logical level 0, and assumes its ON state when the clock signal $\phi2$ is in the logical level 1 so as to apply a common mode reference signal $V_{CM}$ to a line L3a. The common mode reference signal $V_{CM}$ is a common mode voltage in the above-described differential amplification portion 1, and push-pull amplification portions 5 and 6. The switching element SW4a assumes its OFF state when the clock signal $\phi1$ is in the logical level 0, and assumes its ON state when the clock signal $\phi1$ is in the logical level 1 so as to apply the voltage on the line L3a to a line L4a. The capacitor C1a is connected between the lines L1a and L3a and the capacitor C2a is connected between the lines L2a and L4a. The line L2a is connected to a gate terminal of the above-described MOS transistor M1a. The difference signal VON1 transmitted from the differential amplification portion 1 is applied to the line L4a. The switching element SW5a assumes its OFF state when the above-described clock signal $\phi2$ is in the logical level 0, and in an ON state when the clock signal $\phi2$ is in the logical level 1 so as to apply the common mode reference signal $V_{CM}$ to a line L5a. The switching element SW6a assumes its OFF state when the clock signal $\phi1$ is in the logical level 0, and in an ON state when the clock signal $\phi1$ is in the logical level 1 so as to apply the voltage on the above-described line L5a to the line L4a. The switching element SW7a assumes its OFF state when the above-described clock signal $\phi2$ is in the logical level 0, and in an ON state when the clock signal $\phi2$ is in the logical level 1 so as to apply a bias voltage VBIAS2 to a line L6a. The bias voltage VBIAS2 is a fixed bias voltage having a voltage value capable of driving MOS transistors M2a, M2b, M3a, M3b, M4a and M4b (described later) of each of the push-pull amplification portions 5 and 6. The switching element SW8a assumes its OFF state when the clock signal $\phi1$ is in the logical level 0, and assumes its ON state when the clock signal $\phi1$ is in the logical level 1 so as to apply the voltage on the above-described line L6a to a line L7a. The capacitor C3a is connected between the lines L5a and L6a and the capacitor C4a is connected between the lines L7a and L4a. The line L7a is connected to a gate terminal of the above-described MOS transistor M2a.

According to the structure described above, the level shift portion 3 supplies a drive signal G1a, which is obtained by shifting the level of the difference signal VON1 supplied from the above-described difference amplification portion 1 to a level capable of driving the MOS transistor M1a of the push-pull amplification portion 5, to the gate terminal of the MOS transistor M1a via the line L2a. The level shift portion 3 also supplies a drive signal G2a, which is obtained by shifting the level of the difference signal VON1 to a level capable of driving the MOS transistor M2a of the push-pull amplification portion 5, to the gate terminal of the MOS transistor 2a via the line L7a.

The level shift portion 4 is a switched capacitor type level shifter which comprises switching elements SW1b to SW8b and capacitors C1b to C4b. The switching element SW1b assumes its OFF state when the clock signal $\phi2$ is in the logical level 0, and assumes its ON state when the clock signal $\phi2$ is in the logical level 1 so as to apply the above-described bias voltage $V_{BIAS1}$ to a line L1b. The switching element SW2b assumes its OFF state when the clock signal $\phi1$ is in the logical level 0, and assumes its ON state when the clock signal $\phi1$ is in the logical level 1 so as to apply the voltage on the line L1b to a line L2b. The switching element SW3b assumes its OFF state when the clock signal $\phi2$ is in the logical level 0, and assumes its ON state when the clock signal $\phi2$ is in the logical level 1 so as to apply the above-described common mode reference signal $V_{CM}$ to a line L3b. The switching element SW4b assumes its OFF state when the clock signal $\phi1$ is in the logical level 0, and assumes its ON state when the clock signal $\phi1$ is in the logical level 1 so as to apply the voltage on the line L3b to a line L4b. The capacitor C1b is connected between the lines L1b and L3b and the capacitor C2b is connected between the lines L2b and L4b. The line L2b is connected to a gate terminal of the above-described MOS transistor M1b. The difference signal VOP1 transmitted from the differential amplification portion 1 is applied to the line L4b. The switching element SW5b assumes its OFF state when the above-described clock signal $\phi2$ is in the logical level 0, and assumes its ON state when the clock signal $\phi2$ is in the logical level 1 so as to apply the common mode reference signal $V_{CM}$ to a line L5b. The switching element SW6b assumes its OFF state when the clock signal $\phi1$ is in the logical level 0, and assumes its ON state when the clock signal $\phi1$ is in the logical level 1 so as to apply the voltage on the above-described line L5b to the line L4b. The switching element SW7b assumes its OFF state when the above-described clock signal $\phi2$ is in the logical level 0, and assumes its ON state when the clock signal $\phi2$ is in the logical level 1 so as to apply the bias voltage $V_{BIAS2}$ to a line L6b. The switching element SW8b assumes its OFF state when the clock signal $\phi1$ is in the logical level 0, and assumes its ON state when the clock signal $\phi1$ is in the logical level 1 so as to apply the voltage on the above-described line L6b to a line L7b. The capacitor C3b is connected between the lines L5b and L6b and the capacitor C4b is connected between the lines L7b and L4b. The line L7b is connected to a gate terminal of the above-described MOS transistor M2b.

With the structure described above, the level shift portion 4 supplies a drive signal G1b, which is obtained by shifting the level of the difference signal VOP1 supplied from the above-described difference amplification portion 1 to a level capable of driving the MOS transistor M1b of the push-pull amplification portion 6, to the gate terminal of the MOS transistor M1b via the line L2b. The level shift portion 4 also supplies a drive signal G2b, which is obtained by shifting the level of the difference signal VOP1 to a level capable of driving the MOS transistor M2b of the push-pull amplification portion 6, to the gate terminal of the MOS transistor M2b via the line L7b.

Below, level shift operation by the level-shift portions 3 and 4 described above will be explained with reference to FIG. 2, by specifically describing the level shift portion 3.

First, when the clock signal φ1 is in the logical level 0 and the clock signal φ2 is in the logical level 1 (first period T1), the switching elements SW1a, SW3a, SW5a and SW7a respectively assume the ON state, and the switching elements SW2a, SW4a, SW6a and SW8a respectively assume the OFF state. Accordingly. the bias voltage $V_{BIAS1}$ and the common mode reference voltage $V_{CM}$ are respectively applied to one and the other terminals of the capacitor C1a during this period, and the capacitor C1a is charged in accordance with the application of the bias voltage $V_{BIAS1}$ and the common mode reference voltage $V_{CM}$. Furthermore, the bias voltage $V_{BIAS2}$ and the common mode reference voltage $V_{CM}$ are respectively applied to one and the other terminals of the capacitor C3a during this period, and the capacitor C1a is charged in accordance with the application of the bias voltage $V_{BIAS2}$ and the common mode reference voltage $V_{CM}$.

When the clock signal φ1 is in the logical level 1 and the clock signal φ2 is in the logical level 0 (second period T2), the switching elements SW1a, SW3a, SW5a and SW7a assume the OFF state, and the switching elements SW2a, SW4a, SW6a and SW8a assume the ON state. Accordingly, the one terminals of the capacitors C1a and C2a are mutually connected and the other terminals of the capacitors C1a and C2a are mutually connected during this period. Furthermore, the one terminals of the capacitors C3a and C4a are mutually connected and the other terminals of the capacitors C3a and C4a are mutually connected during this period. As a result, the electric charge accumulated in the capacitor C1a is discharged, and a part of the electric charge accumulated in the capacitor C1a is supplied to the capacitor C2a. Similarly, the electric charge accumulated in the capacitor C3a is discharged, and a part of the electric charge accumulated in the capacitor C3a is supplied to the capacitor C4a.

By the repetitive execution of the operations in the first and second periods, the electric potential at the one electrodes of the capacitors C1a and C2a becomes equal to the bias voltage $V_{BIAS1}$ and the electric potential at the other electrodes of the capacitors C1a and C2a becomes equal to the common mode reference voltage $V_{CM}$. Accordingly, when the difference signal VON1 transmitted from the differential amplification portion 1 is supplied to the other terminals respectively of the capacitors C1a and C2a, the drive signal G1a having a level that is reduced by an amount of ($V_{BIAS1}$-$V_{CM}$) from the level of the difference signal VON1 is generated, and supplied to the gate of the transistor M1a via the line L2a. Similarly, the electric potential at the one electrode of the capacitors C3a and C4a becomes equal to the bias voltage $V_{BIAS2}$ and the electric potential at the other electrodes of the capacitors C3a and C4a becomes equal to the common mode reference voltage $V_{CM}$. Accordingly, when the difference signal VON1 transmitted from the differential amplification portion 1 is supplied to the other terminals respectively of the capacitors C3a and C4a, the drive signal G2a having a level that is reduced by an amount of ($V_{BIAS2}$-$V_{CM}$) from the level of the difference signal VON1 is generated, and supplied to the gate of the transistor M2a via the line L7a.

The push-pull amplification portion 5 comprises a p-channel MOS (Metal Oxide Semiconductor) transistor Mia as a high-side drive transistor in the push-pull circuit and an n-channel MOS transistor M2a as a low-side drive transistor in the push-pull circuit. The push-pull amplification portion 5 further comprises an n-channel MOS transistor M3b as a transistor for adjusting a common mode voltage, an n-channel MOS transistor M4a as a transistor for an auxiliary current drive (for assisting current drive), a resistor Ra as a zero-point compensation resistor, and a capacitor C5a as a phase compensation capacitor. The power voltage VDD is applied to the source terminal of the transistor M1a and the drain terminal thereof is connected to the drain terminal of the transistor M2a via the output line LGa. To the gate terminal of the transistor M1a, the drive signal G1a transmitted from the level shift portion 3 is supplied via the line L2a, as described above. The ground voltage VSS is applied to the source terminal of the transistor M2a and the drain terminal thereof is connected to the drain terminal of the transistor M1a via the output line LGa as described above. The ground voltage VSS is applied to the source terminal of the transistor M3a for adjusting the common mode voltage, and the drain terminal thereof is connected to the output line LGa. The common mode voltage adjusting signal CM (described below) from the CMFB 7 is supplied to the gate terminal of the transistor M3a. The ground voltage VSS is supplied to the source terminal of the transistor M4a for the auxiliary current drive, and the drain terminal thereof is connected to the output line LGa. An auxiliary drive signal GCa (described below) from the auxiliary drive control portion 8 is supplied to the gate terminal of the transistor M4a. A series circuit of the resistor Ra as the zero-point compensation resistor and the capacitor C5a as a capacitor for phase compensation is connected between the line L4a and the output line LGa.

With the structure described above, the transistors M1a and M2a of the push-pull amplification portion 5 generate an amplified difference signal VON2 of negative polarity by amplifying the difference signal VON1 in response to the above-described drive signals G1a and G2a, and output the generated negative polarity amplified difference signal VOP2 via the output line LGa (output of the amplified difference signal VON2). The amplified difference signal VON2 is also supplied to the CMFB 7.

The transistor Mia of the push-pull amplification portion 5 adjusts the level of the amplified difference signal VON2 so that a center level of the amplified difference signals VON2 and the VOP2 coincides with the common mode reference signal $V_{CM}$ by the flow of a current according to the common mode voltage adjusting signal CM supplied from the CMFB 7, which will be described below, between the source and drain thereof (common mode voltage adjustment).

Furthermore, the transistor M4a of the push-pull amplification portion 5 increases the current supply capability under the above-described common mode voltage regulation, or increases the current supply capability under the output of the amplified difference signal VON2 by the flow of a current according to the auxiliary drive signal GCa between the source and drain thereof.

The push-pull amplification portion 6 comprises a p-channel MOS transistor M1b as a high-side drive transistor in the push-pull circuit and an n-channel MOS transistor M2b as a low-side drive transistor in the push-pull circuit. The push-pull amplification portion 6 further comprises an n-channel MOS transistor M3b as a transistor for adjusting a common mode voltage, an n-channel MOS transistor M4b as a transistor for an auxiliary current drive (for assisting current drive), a resistor Rb as a zero-point compensation resistor, and a capacitor C5b as a phase compensation capacitor. The power voltage VDD is applied to the source terminal of the transistor M1b and the drain terminal thereof is connected to the drain terminal of the transistor M2b via the output line LGb. To the gate terminal of the transistor M1b, the drive signal G1b transmitted from the level shift portion 4 is supplied via the line L2b, as described above. The ground voltage VSS is applied to the source terminal of the transistor M2b and the drain terminal thereof is connected to the drain terminal of the transistor M1b via the output line LGb as described above. The ground voltage VSS is applied to the source terminal of the transistor M3a for adjusting the common mode voltage, and the drain terminal thereof is connected to the output line LGb. The common mode voltage adjusting signal CM (described below) from the CMFB 7 is supplied to the gate terminal of the transistor M3b. The ground voltage VSS is supplied to the source terminal of the transistor M4b for the auxiliary current drive, and the drain terminal thereof is connected to the output line LGb. An auxiliary drive signal GCb (described below) from the auxiliary drive control portion 8 is supplied to the gate terminal of the transistor M4b. A series circuit of the resistor Rb as the zero-point compensation resistor and the capacitor C5b as a capacitor for phase compensation is connected between the line L4b and the output line LGb.

With the structure described above, the transistors M1b and M2b of the push-pull amplification portion 6 generate an amplified difference signal VOP2 of positive polarity by amplifying the difference signal VOP1 in response to the above-described drive signals G1b and G2b, and output the generated positive polarity amplified difference signal VOP2 via the output line LGb (output of the amplified difference signal VOP2). The amplified difference signal VOP2 is also supplied to the CMFB 7.

The transistor M3b of the push-pull amplification portion 6 adjusts the level of the amplified difference signal VOP2 so that a center level of the amplified difference signals VON2 and the VOP2 coincides with the common mode reference signal $V_{CM}$ by the flow of a current according to the common mode voltage regulation signal CM supplied from the CMFB 7, which will be described later, between the source and drain thereof (common mode voltage adjustment).

Furthermore, the transistor M4b of the push-pull amplification portion 6 increases the current supply capability under the above-described common mode voltage regulation, or increases the current supply capability under the output of the amplified difference signal VOP2 by the flow of a current according to the auxiliary drive signal GCb between the source and drain thereof.

Figure 3:
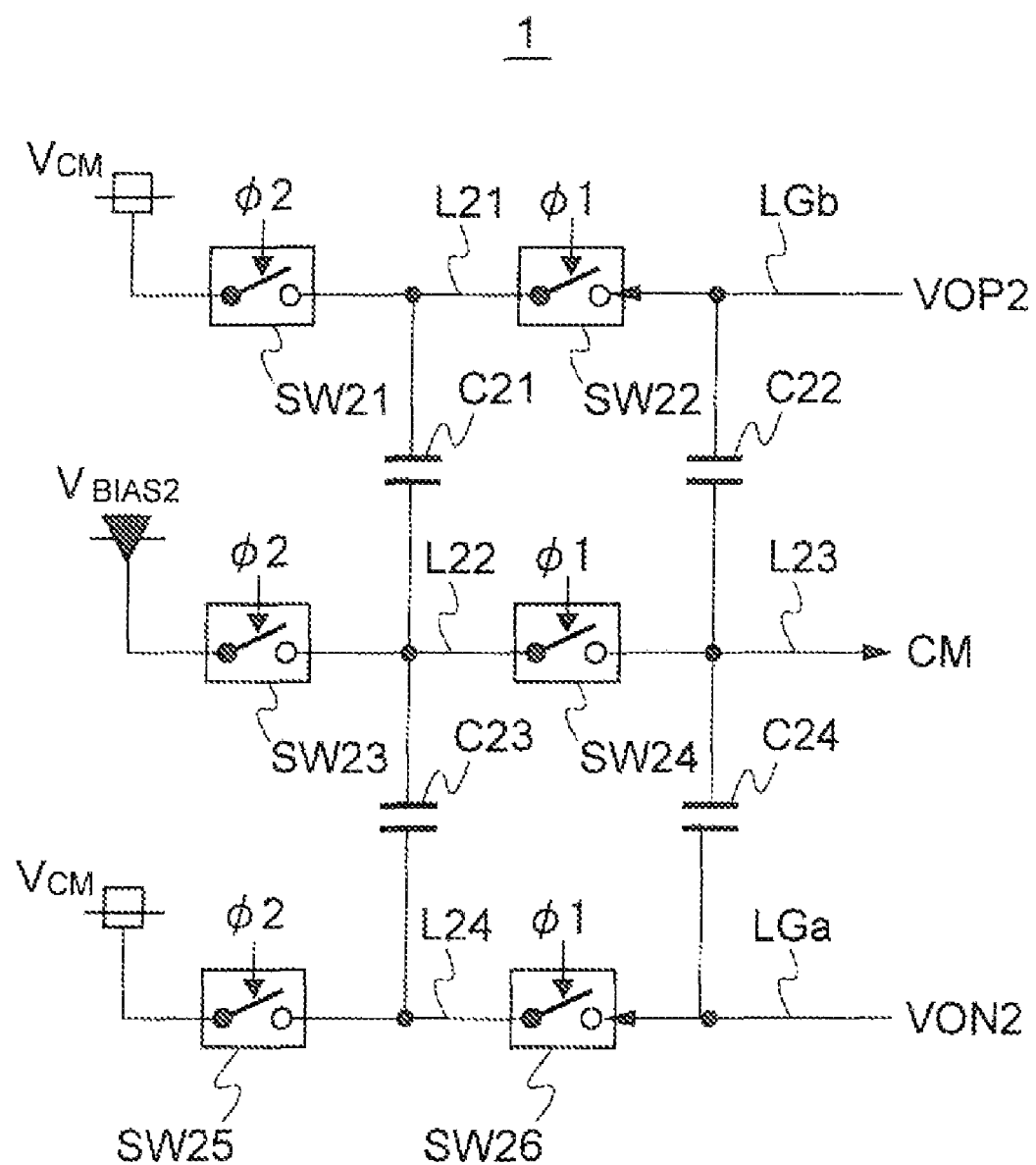
FIG. 3 is a diagram showing an example of the internal construction of the CMFB 7.

The CMFB 7 is a common mode feedback circuit of the switched capacitor type, and for example has such an internal structure as shown in FIG. 3.

As shown in FIG. 3, the CMFB 7 comprises switching elements SW21 to SW26 and capacitors C21 to C24. The switching element SW21 assumes its OFF state when the above-described clock signal φ2 is in the logical level 0, and assumes its ON state when the clock signal φ2 is in the logical level 1, to supply the common mode reference signal $V_{CM}$ to a line L21. The switching element SW22 assumes its OFF state when the clock signal φ1 is in the logical level 0, and assumes its ON state when the clock signal φ1 is in the logical level 1, to electrically connect the above-described output line LGb and the line L21. The switching element SW23 assumes its OFF state when the above-described clock signal φ2 is in the logical level 0, and assumes its ON state when the clock signal φ2 is in the logical level 1, to apply the bias voltage $V_{BIAS2}$ to a line L22. The switching element SW24 assumes its OFF state when the clock signal φ1 is in the logical level 0, and assumes its ON state when the clock signal φ1 is in the logical level 1, to apply the voltage on the above-described line 22 to a line L23. The capacitor C21 is connected between the lines L21 and L22 and the capacitor C22 is connected between the output lines LGb and L23. The switching element SW25 assumes its OFF state when the above-described clock signal φ2 is in the logical level 0, and assumes its ON state when the clock signal φ2 is in the logical level 1, to supply the common mode reference signal $V_{CM}$ to a line L24. The switching element SW26 assumes its OFF state when the clock signal φ1 is in the logical level 0, and assumes its ON state when the clock signal φ1 is in the logical level 1, to electrically connect the output lines LGa and the line L24. The capacitor C23 is connected between the output lines L22 and L24 and the capacitor C24 is connected between the output lines LGa and L23. The above-described capacitors C21 and C23 have a same capacitance with each other and the capacitors C22 and C24 have a same capacitance with each other.

The operation of the CMFB shown in FIG. 3 will be explained with reference to FIG. 2.

First, when the clock signal φ1 is in the logical level 0 and the clock signal φ2 is in the logical level 1, the switching elements SW21, SW23 and SW25 assume the ON state, and the switching elements SW22, SW24 and SW26 assume the OFF state. Thus, the bias voltage $V_{BIAS2}$ and the common mode reference voltage $V_{CM}$ are applied to the one and the other terminals of the capacitor C21, respectively, to charge the capacitor C21, and the bias voltage $V_{BIAS2}$ the common mode reference voltage $V_{CM}$ are applied to the one and the other terminals of the capacitor C23, respectively, to charge the capacitor C23 (the first period T1). Second, when the clock signal φ1 is in the logical level 1 and the clock signal φ2 is in the logical level 0, the switching elements SW21, SW23 and SW25 assume the OFF state, and the switching elements SW22, SW24 and SW26 assume the ON state. Thus, the one terminals of the capacitors C21 and C22 are mutually connected and the other terminals of the capacitors C21 and C22 are mutually connected. Furthermore, the one terminals of the capacitors C23 and C24 are mutually connected and the other terminals of the capacitors C23 and C24 are mutually connected. Consequently, the electric charge accumulated in the capacitor C21 is discharged and a part of the charge is supplied to the capacitor C22. At the same time, the electric charge accumulated in the capacitor C23 is discharged and a part of the charge is supplied to the capacitor C24 (the second period T2).

By the repetitive execution of the operations in the first period T1 and the second period T2 described above, the electric potential at the one electrodes of the capacitors C22 and C24, that is, the electric potential on the line L23, becomes equal to the bias voltage $V_{BIAS2}$, and the electric potential at the other electrodes of the capacitors C22 and C24, that is the electric potential on the output lines LGa and LGb becomes equal to the common mode reference voltage $V_{CM}$. Accordingly, when the amplified difference signal VOP2 and VON2 having different polarity are supplied via the output lines LGa and LGb, a level that is reduced (level-shifted) by an amount of ($V_{BIAS2}$-$V_{CM}$) from a difference value between the center value of the amplified difference signals VOP2 and VON2 and the common mode reference voltage $V_{CM}$ appears on the line L23. In this state, the CMFB 7 produces the level on the line L23 as the common mode voltage adjustment signal CM.

As shown in FIG. 1, the auxiliary drive control portion 8 comprises switching elements SW9a to SW11a and a capacitor C10a. The switching element SW9a assumes its OFF state when the above-described clock signal φ1 is in the logical level 0, and assumes its ON state when the clock signal φ1 is in the logical level 1, to supply the common mode reference signal $V_{CM}$ to a line L8a. The switching element SW10a assumes its OFF state when the clock signal φ2 is in the logical level 0, and assumes its ON state when the clock signal φ2 is in the logical level 1, to apply the difference signal VON1 on the line L4a to the line L8a. The one electrode of the capacitor C10a is connected to the line L8a and the other electrode thereof is connected to the switching element SW1a and to the gate terminal of the transistor M4a of the push-pull amplification portion 5 via a line L9a. The switching element SW 11a assumes its OFF state when the clock signal φ1 is in the logical level 0, and assumes its ON state when the clock signal φ1 is in the logical level 1, to supply the common mode voltage adjustment signal CM supplied from the above-described CMFB 7 to the line L9a. The auxiliary drive control portion 8 supplies the voltage on the line L9a to the gate of the transistor M4a of the push-pull amplification portion 5 as the auxiliary drive signal GCa.

The auxiliary drive control portion 9 comprises switching elements SW9b to SW11b and a capacitor C10b. The switching element SW9b assumes its OFF state when the above-described clock signal φ1 is in the logical level 0, and assumes its ON state when the clock signal φ1 is in the logical level 1, to supply the common mode reference signal $V_{CM}$ to a line L8b. The switching element SW10b assumes its OFF state when the clock signal φ2 is in the logical level 0, and assumes its ON state when the clock signal φ2 is in the logical level 1, to apply the difference signal VOP1 on the line L4b to the line L8b. The one electrode of the capacitor C10b is connected to the line L8b and the other electrode thereof is connected to the switching element SW1b and to the gate terminal of the transistor M4b of the push-pull amplification portion 6 via a line L9b. The switching element SW 11b assumes its OFF state when the clock signal φ1 is in the logical level 0, and assumes its ON state when the clock signal φ1 is in the logical level 1, to supply the common mode voltage adjustment signal CM supplied from the above-described CMFB 7 to the line L9b. The auxiliary drive control portion 9 supplies the voltage on the line L9b to the gate of the transistor M4b of the push-pull amplification portion 6 as the auxiliary drive signal GCb.

Operations of the above-described auxiliary drive control portion 8 and 9 will be explained, only referring to the auxiliary drive control portion 8.

When the clock signal φ1 is in the logical level 0 and the clock signal φ2 is in the logical level 1 (the first period T1), the switching element SW10a assumes the ON state, and the switching elements SW9a and SW11a assume the OFF state. When the clock signal φ1 is in the logical level 1 and the clock signal φ2 is in the logical level 10 (the second period T2), the the switching elements SW9a and SW11a assume the ON state, and the switching element SW10a assumes the OFF state.

Thus, in the second period T2 the common mode voltage adjustment signal CM supplied from the CMFB 7 is supplied to the gate of the transistor M4a of the push-pull amplification portion 5 as the above-described auxiliary drive signal GCa via the switching element SW11a. Consequently, like the transistor Mia the transistor M4a operates in the "common mode voltage adjustment mode" in which a current according to the common mode voltage adjustment signal CM flows between the source and drain thereof, as depicted in FIG. 2. Thus, as compared with a case in which the transistor M3a only performs the common mode voltage adjustment, the current driving capability can be increased in this period by the operation of the transistor M4a in the "common mode voltage adjustment mode." In the second period T2 described above, the capacitor C10a of the auxiliary drive control portion 8 is put in a state that the common mode reference signal CM is applied to the one terminal of the capacitor C10a via the switching element SW9a, and the bias voltage NBIAS2 based on the common mode voltage adjustment signal CM is applied to the other terminal of the capacitor C10a. Accordingly, the capacitor C10a of the auxiliary drive control portion 8 is charged by the bias voltage NBIAS2 and the common mode voltage adjustment signal CM during the second period T2.

In the first period T1, the difference signal VON1 transmitted from the differential amplification portion 1 is supplied to the one terminal of the capacitor C10a via the switching element SW10a. In this instant, a voltage ($V_{BIAS2}$-$V_{CM}$) associated with the charging in the above-described second period T2 that immediately precedes the first period T1 is generated across the electrodes of the capacitor 10a. Accordingly, in the first period T1, the voltage that is shifted by the voltage ($V_{BIAS2}$-$V_{CM}$) from the level of the difference signal VON1 by means of the capacitor C10a is supplied to the gate terminal of the transistor M4a of the push-pull amplification portion 5 as the above-described auxiliary drive signal GCa. Consequently, like the transistor M2a the transistor M4a operates in a "amplified difference signal outputting mode" in which the amplified difference signal VON2 is generated by the flow of a current corresponding to the difference signal VON1 between the source and drain thereof, as illustrated in FIG. 2. Accordingly, the transistor M4a operates in the "amplified difference signal outputting mode" for the first period T1, and the current driving capability is increased as compared with a case in which the amplifier difference signal VON2 is produced by the transistor M2a only.

As explained above, with the operational amplifier shown in FIG. 1, the auxiliary drive transistors (M4a and M4b) for increasing the current driving capability together with the transistors (M3a and M3b) for adjusting the common mode voltage are provided in parallel with the low-voltage side drive transistors (M2a and M2b) of the push-pull output stages (8 and 9). In this arrangement, the current driving capability at the time of the common mode voltage adjustment is increased by driving the auxiliary drive transistors (M4a, M4b) in accordance with the common mode voltage adjustment signal (CM) in the period (T2) for charging the first capacitors (C1a, C3a, C1b, and C3b) of the level shift portions (3, 4). In the period (T1) for supplying the electric charge accumulated in the first capacitors (C1a, C3a, C1b, and C3b) to the second capacitors (C2a, C4a, C2b, and C4b), the current driving capability at the time of outputting the amplified difference signal (VON2, VOP2) is increased by driving the auxiliary drive transistors (M4a, M4b) in accordance with the difference signal (VON1, VOP1). Thus, a high-speed self adjustment just as much as the increase in the current driving capability in the common-mode voltage adjustment is enabled and lowering of the current driving capability during the period of outputting the amplified difference signal is suppressed at the same time.

Figure 4:
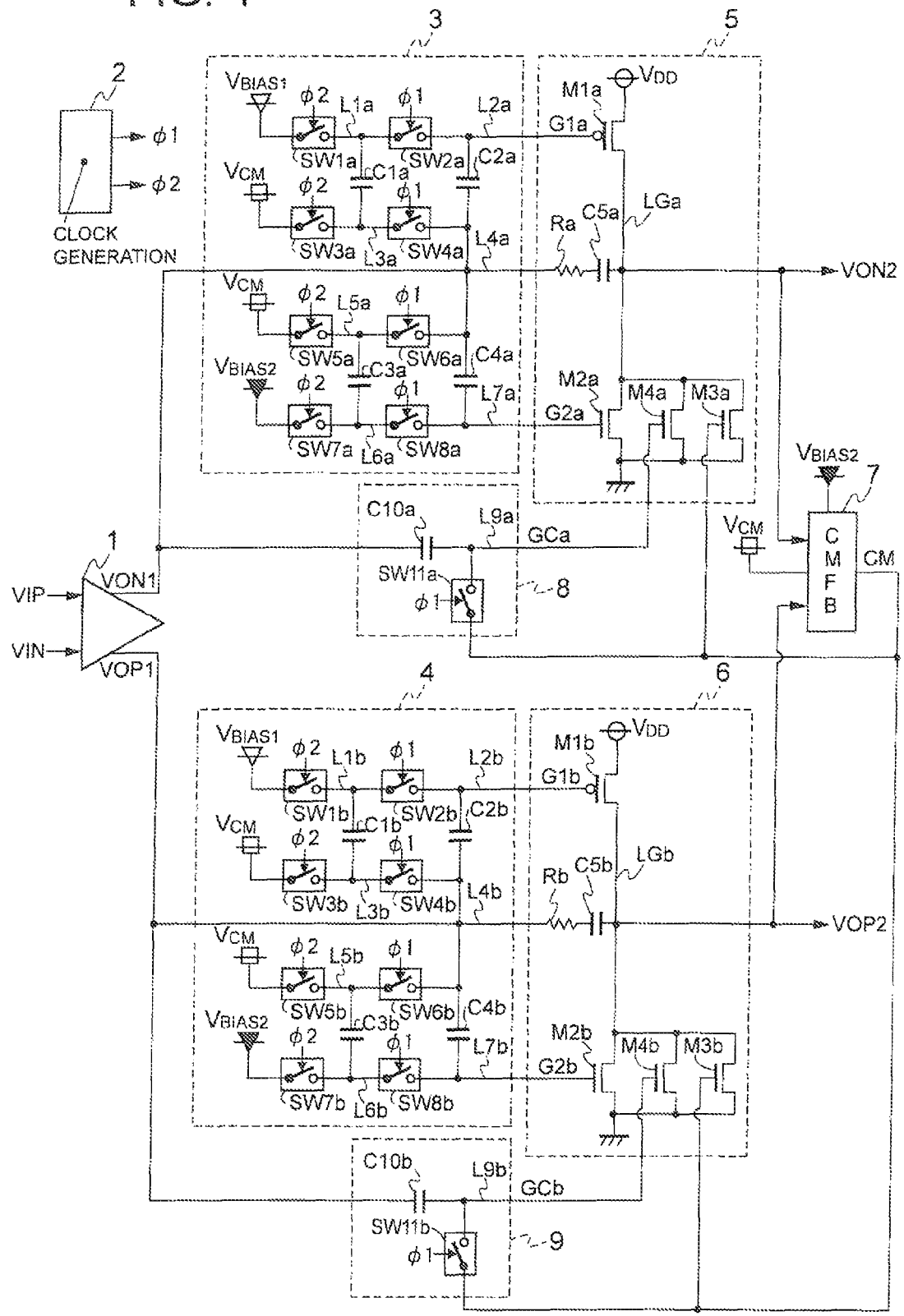
FIG. 4 is a diagram showing a modification of the operational amplifier shown in FIG. 1.

Additionally, in the auxiliary drive control portions 8 and 9 in the embodiment shown in FIG. 1, the common mode reference voltage VC and the difference signal VON1 (VOP1) are applied to the one terminal of the capacitor C10a (C10b) respectively in the period (T1) and the period (T2) by the switching elements SW9a and SW10a (SW9b and SW10b). However, it is possible to arrange the apparatus in a manner that the difference signal VON1 (VOP1) is always applied to the one terminal of the capacitor C10a (C10b) as shown in FIG. 4. In the arrangement shown in FIG. 4, the switching elements SW9a and SW10a (SW9b and SW10b) in the auxiliary drive control portions 8 and 9 are omitted and the difference signal VON1 (VOP1) is always applied to the one terminal of the capacitor C10a (C10b). The structure other than these changes is identical to that shown in FIG. 1.

This application is based on Japanese Patent Application No. 2010-116262 which is herein incorporated by reference.

What is claimed is:

1. An operational amplifier for amplifying difference signals that indicate a difference value between levels of the first and second input signals and outputting first and second amplified difference signals having different polarities, comprising:
    level shift portions which produce as drive signals signals obtained by level shifting said difference signals by predetermined values;
    a push-pull amplification circuits which produce said first amplified difference signal and said second amplified difference signal in accordance with said drive signals;
    a common mode voltage adjustment signal generating portion which generates a common mode voltage adjustment signal indicating a difference between a center value of said first and second amplified difference signals and a common mode reference voltage value;
    common mode voltage adjusting transistors each of which is connected in parallel to a low voltage side drive transistor of each of said push-pull amplification circuit and allows a flow of a current according to said common mode voltage adjustment signal;
    auxiliary drive transistors each of which is connected in parallel to a low voltage side drive transistor of each of said push-pull amplification circuit and allows a flow of a current according to an auxiliary drive signal; and
    auxiliary drive control portions each of which alternately supplies said signal obtained by level shifting said difference signal and said common mode voltage adjustment signal to said auxiliary drive transistor as said auxiliary drive signal.

2. An operational amplifier as claimed in claim 1, further comprising:
    a clock generating portion which generates a clock signal having a first level state and a second level state alternating at predetermined intervals,
    wherein each of said level shift portions comprises a first capacitor, a second capacitor connected between a transmission line of said difference signal and a gate of said low-voltage side drive transistor, a first switching element that performs charging of said first capacitor by applying a first voltage and said common mode reference voltage to both terminals of said first capacitor respectively during a period in which said clock signal is in the first level state, and a second switching element that supplies electric charge accumulated on said first capacitor to said second capacitor during a period in which said clock signal is in the second level state.

3. An operational amplifier as claimed in claim 2, wherein said auxiliary drive control portion comprises:
    a third capacitor having one terminal connected to a gate of said auxiliary drive transistor;
    a third switching element which supplies said common mode voltage adjustment signal to one terminal of said third capacitor and to the gate of said auxiliary drive transistor during the period in which said clock signal is in said first level state;
    a fourth switching element which supplies said common mode voltage adjustment signal to the other terminal of said third capacitor during the period in which said clock signal is in said first level state; and
    a fifth switching element which supplies said difference signal to said other terminal of said third capacitor during the period in which said clock signal is in said second level state.

4. An operational amplifier as claimed in claim 2, wherein said auxiliary drive control portion comprises:
    a third capacitor having one terminal connected to a gate of said auxiliary drive transistor and the other terminal connected to a transmission line of said difference signal; and
    a third switching element which supplies said common mode voltage adjustment signal to one terminal of said third capacitor and to the gate of said auxiliary drive transistor during the period in which said clock signal is in said first level state.

\* \* \* \* \*